United States Patent
Liou et al.

(10) Patent No.: US 7,865,812 B2
(45) Date of Patent: Jan. 4, 2011

(54) APPARATUS AND METHOD FOR DETERMINING A DETECTED PUNCTURED POSITION IN PUNCTURED CONVOLUTIONAL CODES

(75) Inventors: Ming-Luen Liou, Taipei County (TW); Rong-Liang Chiou, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 993 days.

(21) Appl. No.: 11/675,664

(22) Filed: Feb. 16, 2007

(65) Prior Publication Data

US 2008/0201628 A1   Aug. 21, 2008

(51) Int. Cl.
*H03M 13/35*   (2006.01)
(52) U.S. Cl. ...................................... 714/790
(58) Field of Classification Search ................. 714/790
See application file for complete search history.

(56) References Cited

U.S. PATENT DOCUMENTS

| | | | | |
|---|---|---|---|---|
| 4,462,101 A | * | 7/1984 | Yasuda et al. | 714/794 |
| 4,939,734 A | * | 7/1990 | Heichler | 714/790 |
| 5,029,331 A | * | 7/1991 | Heichler et al. | 714/790 |
| 5,434,886 A | | 7/1995 | Kazawa et al. | |
| 5,668,820 A | | 9/1997 | Ramesh et al. | |
| 5,691,992 A | | 11/1997 | Molnar et al. | |
| 5,708,665 A | | 1/1998 | Luthi et al. | |
| 5,790,566 A | * | 8/1998 | Laskowski | 714/746 |
| 5,812,603 A | | 9/1998 | Luthi et al. | |
| 5,832,001 A | * | 11/1998 | Choi | 714/790 |
| 5,937,016 A | * | 8/1999 | Choi | 375/341 |
| 6,094,741 A | * | 7/2000 | Koyama et al. | 714/795 |
| 6,728,323 B1 | | 4/2004 | Chen et al. | |
| 6,732,326 B2 | * | 5/2004 | Choi et al. | 714/790 |
| 6,993,702 B2 | * | 1/2006 | Lee et al. | 714/790 |
| 7,065,696 B1 | * | 6/2006 | Liu et al. | 714/755 |
| 7,095,808 B1 | * | 8/2006 | Shohara | 375/340 |
| 7,131,055 B2 | | 10/2006 | Mathew et al. | |
| 7,478,306 B2 | | 1/2009 | Okamoto et al. | |
| 7,568,058 B2 | * | 7/2009 | Chen et al. | 710/62 |
| 7,590,925 B2 | * | 9/2009 | Chiou | 714/790 |
| 2003/0192001 A1 | | 10/2003 | Maiuzzo et al. | |
| 2009/0055717 A1 | | 2/2009 | Au et al. | |

OTHER PUBLICATIONS

Office Action mailed in related U.S. Appl. No. 11/160,927.

* cited by examiner

*Primary Examiner*—Stephen M Baker
(74) *Attorney, Agent, or Firm*—Thomas, Kayden, Horstemeyer & Risley

(57) ABSTRACT

An apparatus for generating a detected punctured position in punctured convolutional codes. A delay line circuit has a plurality of delay elements connected in series, storing a finite sequence of an input bit stream. A logic gate circuit, coupled to outputs of a part of the delay elements of the delay line circuit in accordance with a parity check polynomial, performs a logic operation to output a number stream. The number stream is accumulated for possible punctured positions and the one of the possible punctured positions with a minimal accumulated number is selected and determined as the detected punctured position.

23 Claims, 8 Drawing Sheets

APPARATUS AND METHOD FOR DETERMINING A DETECTED PUNCTURED POSITION IN PUNCTURED CONVOLUTIONAL CODES

CROSS-REFERENCE TO RELATED APPLICATIONS

This application is related to U.S. patent application Ser. No. 11/684,029 entitled "Apparatus and Method for Calculating Error Metrics in a Digital Communication System" (filed on Mar. 9, 2007), which is assigned to the same applicant and is hereby incorporated in its entirety herein by this reference.

BACKGROUND

The invention relates to communication of digital data using trellis coded modulation with punctured convolutional codes. In particular, the invention relates to a depuncture technique employed in a receiver to process punctured convolutional codes in digital communication systems.

FIG. 1 (Related Art) is a block diagram of a typical digital communication system, which includes a transmitter 10, a receiver 20 and a channel 30 for transmitting data, which may be speech, images, video and others. As shown in FIG. 1, transmitter 10 includes a forward-error-correction (FEC) encoder 12, which encodes information bits using a convolutional encoder, and a modulator 14, which utilizes one or more of various modulation schemes, such as Phase Shift Keying (PSK) and Quadrature Amplitude Modulation (QAM), to modulate the output of the FEC encoder 12. The modulated symbol stream is tuned to the desired band and desired carrier frequency by a radio processor (not shown) for transmission. Conversely, the transmitted symbol stream is received and processed by receiver 20. Demodulator 24 demodulates the received symbol stream using a demodulation scheme associated with the modulation scheme utilized in the transmitter 10 and FEC decoder 22 decodes the demodulated symbols into the recovered bits using a convolutional decoder.

The FEC encoder/decoder employs convolutional codes, one type of error correction codes, and widely utilized in many practical communication systems to provide transmitted data with error correction capability by generating one or more parity bits from each bit to be transmitted. The ratio of data bits to parity bits is referred to as a code rate. For example, a convolutional encoder with code rate of 1/3 receives one bit and outputs three bits.

A practical example of a digital communication system is illustrated here to explain the FEC scheme. FIG. 2 (Related Art) is a block diagram of a conventional cable modem transmission system using a FEC decoder 12/encoder 2, which complies with the standard of ITU-R Recommendation J-83 Annex B (hereafter called J83B standard). In FIG. 2, modulator 14 and demodulator 24 shown in FIG. 1 are merged into the TCM encoder 126 and the TCM decoder 226, respectively. The J83B standard specifies two modulation/demodulation schemes, including 64- and 256-QAM. The FEC encoder 12 includes a Reed Solomon (RS) encoder 120, a convolutional interleaver 122, a randomizer 124 and a Trellis coded modulation (TCM) encoder 126. In this example, channel 30 represents a cable medium. Conversely, the FEC decoder 22 includes a TCM decoder 226, a de-randomizer 224, a convolutional de-interleaver 222 and a RS decoder 220.

The RS encoder 120 adds redundancy bits into the information bits for correction of up to 3 symbol errors. The convolutional interleaver 122 modifies the order of the RS-encoded information bits to reduce burst mode errors. The randomizer 124 performs a bit-wise exclusive-OR (XOR) operation to assure a random transmitted sequence. The TCM encoder 126 adds redundancy to the data to improve the signal-to-noise ratio by increasing the symbol constellation without increasing the symbol rate, which will be described in detail. The TCM encoded data is sent to the FEC decoder 22 over channel 30. The TCM decoder 226 decodes the TCM encoded data using a decoding scheme, such as Viterbi algorithm. The de-randomizer 224, the convolutional de-interleaver 222 and the RS decoder 220 performs the reverse functions to retrieve the recovered bits.

As described, the 64- or 256-QAM modulator/demodulator is merged into the TCM encoder/decoder, respectively, in the J83B standard. FIG. 3 (Related Art) is a block diagram of a conventional TCM encoder with a 64-QAM modulator shown in FIG. 2. The other example, which uses the 256-QAM modulator/demodulator, can be found in the J83B standard and will be described here. In FIG. 3, the TCM encoder 126 serially receives 128 7-bit FEC frames. Parser 300 identifies a group of four 7-bit symbols (i.e. 28 bits) and assigns as an in-phase "I" component and a quadrature "Q" component. As indicated in FIG. 3, for the I component, the parser 300 outputs two upper uncoded bit streams 302 ($I_1$, $I_4$, $I_7$, $I_{10}$, $I_{12}$) and 301 ($I_2$, $I_5$, $I_8$, $I_{11}$, $I_{13}$) and one lower coded bit stream 305 ($I_0$, $I_3$, $I_6$, $I_9$). For the Q component, the parser 300 outputs two upper uncoded bit streams 304 ($Q_1$, $Q_4$, $I_7$, $Q_{10}$, $Q_{12}$) and 303 ($Q_2$, $Q_5$, $Q_8$, $Q_{11}$, $Q_{13}$) and one lower coded bit stream 306 ($Q_0$, $Q_3$, $Q_6$, $Q_9$). The uncoded bit streams 301, 302, 303 and 304 are sent to a QAM mapper 340, and the coded bit streams 305 and 306 are sent to a differential pre-coder 310. The differential pre-coder 310 performs rotationally invariant trellis coding on I and Q bit pairs, that is, $Q_0$ and $I_0$, $Q_3$ and $I_3$, $Q_6$ and $I_6$, and $Q_9$ and $I_9$. The differential pre-coder 310 then transmits the differentially encoded lower streams X and Y to punctured binary convolutional encoders 320 and 330, respectively.

The punctured binary convolutional encoders 320 and 330 are rate 1/2 binary convolutional encoders with punctured codes. Usually, error correction codes, such as RS codes and TCM codes, add redundancy to upgrade anti-noise capability. Unfortunately, payload will be much reduced due to excessive redundancy if all encoded parity bits are transmitted. Puncturing can be applied to error correction codes to compensate the decrease in payload, which bypasses the transmission of some of the parity bits previously agreed on by the transmitter and the receiver. The punctured binary convolutional encoders 320 and 330, complying with the J85B standard, utilize a puncture rate 5/8, which means that only 5 bits are transmitted for every 8 bits from the convolutional encoder, resulting in an overall punctured code rate 4/5, that is, 5 bits are generated according to 4 input bits.

FIG. 4 (Related Art) is a block diagram of the punctured binary convolutional encoder 320 shown in FIG. 3. The punctured binary convolutional encoder 330 has a structure similar to that of encoder 320 and will not be described again. The punctured binary convolutional encoder 320 includes four registers 321, 322, 323 and 324, two exclusive-OR gates 325 and 326, and a commutator 328. The four registers 321-324 store four previous input bits X[0], X[−1], X[−2] and X[−3], and there are 16 states in the punctured binary convolutional encoder 320. As shown in FIG. 4, codes $OUT_U$ and $OUT_L$ can be expressed by:

$$OUT_U = X[1] \oplus X[-1] \oplus X[-3]; \quad (1)$$

$$OUT_L = X[1] \oplus X[0] \oplus X[-1] \oplus X[-2] \oplus X[-3] \quad (2)$$

Equations (1) and (2) are determined by generating codes G1 and G2, where G1=[010101] and G2=[011111]. It is noted that different convolutional coders have different generating codes. Commutator 328 implements the puncture function using puncture matrix [P1;P2]=[000D;ABCE], where "0" indicates no transmission and "ABCDE" indicate transmission in order.

For each trellis group, the punctured binary convolutional encoder 320 can generate 8 convolutionally encoded bits from 4 input bits represented by X[1], X[2], X[3] and X[4]. The commutator 328 selects 5 bits from the 8 convolutionally encoded bits to be outputs U[1], U[2], U[3], U[4] and U[5] according to the puncture matrix. That is, code puncturing converts a code rate 1/2 to a punctured code rate 4/5 since only 5 encoded bits are retained after puncturing.

Decoding the convolutional codes with puncture codes requires familiarity with convolutional coding mechanism and the puncture matrix. In the J83B cable system, for example, it is also necessary to ascertain the puncture boundary or punctured position from an incoming bit stream since there is no training sequence therein. As illustrated, a group of five output coded bits is generated by four input bits, indicating five possible punctured positions for the incoming bit stream of the TCM decoder in the receiver.

U.S. Pat. No. 6,233,712 discloses a 64/256 Quadrature Amplitude Modulation Trellis Coded Modulation (QAMTCM) decoder, capable of determining the punctured position. As disclosed therein, the decoder includes a depuncture circuit, a Viterbi decoder, a re-encode/puncture circuitry and a synchronization circuit. The incoming QAM signal stream is first demodulated into an in-phase component and a quadrature component. The depuncture 404 generates a depunctured in-phase component and a depunctured quadrature component using a punctured position for testing. The Viterbi decoder generates a decoded in-phase bit and a decoded quadrature bit for each pair of symbols. The re-encode/puncture circuitry performs binary convolutional encoding and puncturing on the decoded in-phase and quadrature bits to recover the incoming encoded symbols for testing. Conversely, the synchronization circuit performs hard decision on the in-phase component and a quadrature component to generate hard symbols, and compares the hard symbols with the recovered encoded symbols for the re-encode/puncture circuitry. If the punctured position for testing is accurate, the difference between the hard symbols and the recovered encoded symbols is minimal.

However, the method for detecting the punctured position adopted by U.S. Pat. No. 6,233,712 requires extra encode/puncture circuitry, increasing manufacturing costs and complicating product design.

SUMMARY

An embodiment of the invention provides an apparatus for determining one of possible punctured positions as a detected punctured position corresponding to an input bit stream, which has been encoded according to a punctured convolutional coding scheme, for example, the TCM scheme, and has a punctured code rate of Z/R, where Z and R are positive integers. In the J83B example, Z is 4 and R is 5, and the punctured code rate is 4/5. The apparatus comprises a delay line circuit, a logic gate circuit, an adder, a buffer circuit and a selector. The delay line circuit has a plurality of delay elements connected in series, storing a finite sequence of the input bit stream. The logic gate circuit has a plurality of inputs, respectively coupled to the outputs of a part of the delay elements of the delay line circuit in accordance with a polynomial, to perform a logic operation on the outputs of the part of the delay elements to output a number stream. The polynomial is a parity check polynomial P(x), which can be expressed by $P(x) = x*(1+x+x^2+x^3+x^4+x^6+x^7+x^{10}+x^{11}+x^{14}+x^{16}+x^{17}+x^{18}+x^{19}+x^{20}+x^{21})$ in the J83B example. The adder sums the number stream and a feedback number stream from the buffer circuit to output an accumulated number stream. The buffer circuit has R buffer elements storing the accumulated number stream, which form the feedback number stream. Each of the R buffer elements is associated with one of possible punctured positions. The selector selects one of the R punctured positions based on the feedback number stream as the detected punctured position.

Another embodiment of the invention provides a method of determining one of possible punctured positions as a detected punctured position corresponding to an input bit stream, which has been encoded according to a punctured convolutional coding scheme and has a punctured code rate of Z/R, where Z and R are positive integers. First, a finite sequence of the input bit stream is stored. A logic operation is performed on part of the finite sequence in accordance with a polynomial to output a number stream. The polynomial is a parity check polynomial P(x), which can be expressed by $P(x) = x*(1+x+x^2+x^3+x^4+x^6+x^7+x^{10}+x^{11}+x^{14}+x^{16}+x^{17}+x^{18}+x^{19}+x^{20}+x^{21})$ in the J83B example. The number stream and a feedback number stream are summed to an accumulated number stream. In addition, the accumulated number stream is stored to form the feedback number stream, where each number of the feedback number stream is associated with one of R possible punctured positions. Finally, one of the R possible punctured positions is selected as the detected punctured position based on the feedback number stream.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION

Preferred embodiments of the invention are demonstrated herein, which are not intended to limit the scope of the invention. In the preferred embodiment, a receiver for the standard recommended by ITU-T (International Telecommunication Union) Recommendation J.83 using 64-QAM/TCM encoding/decoding is illustrated, which is not intended to limit the scope of the invention. For example, the J83B standard using 256-QAM/TCM encoding/decoding can be implemented according to the principles of the preferred embodiment.

First Embodiment

Figure 4:
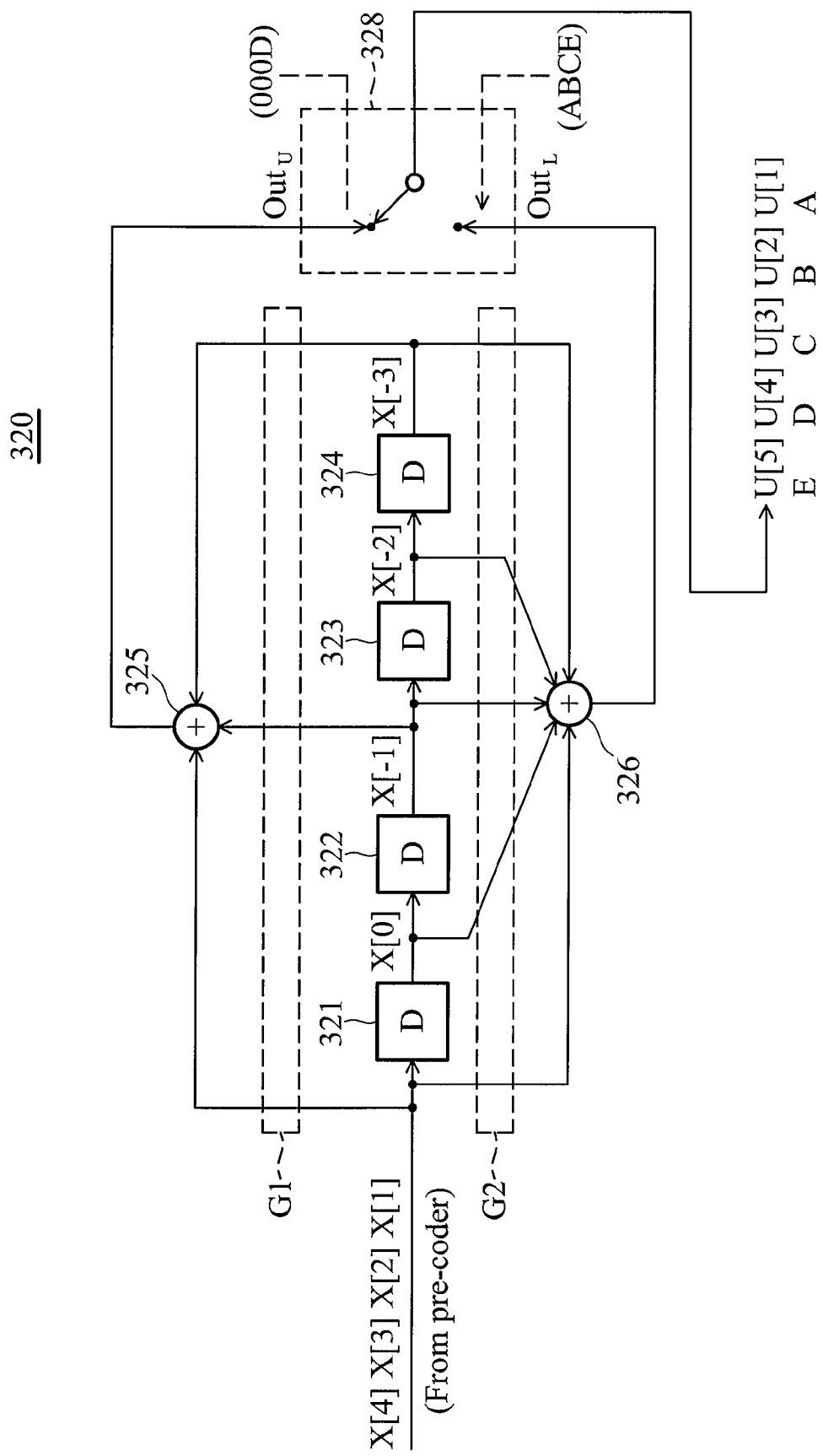
FIG. 4 (Related Art) is a block diagram of the punctured binary convolutional encoder shown in FIG. 3.

As illustrated in FIG. 4, a group of four input bits X[4], X[3], X[2] and X[1] can be encoded to generate a group of five output bits U[5], U[4], U[3], U[2] and U[1] by the punctured binary convolutional encoder 320. According to equations (1) and (2) and the puncture matrix, each output bit can be expressed as a function of the input bits. Here a group of the output bits (U[5],U[4],U[3],U[2],U[1]) is expressed as functions of a corresponding group of the input bits (X[4],X[3],X[2],X[1]) and previous input bits (or internal states of the encoder, X[0],X[−1],X[−2],X[−3]) as follows:

The N-th Group:

$U[1]=X[1] \oplus X[0] \oplus X[-1] \oplus X[-2] \oplus X[-3]$;

$U[2]=X[2] \oplus X[1] \oplus X[0] \oplus X[-1] \oplus X[-2]$;

$U[3]=X[3] \oplus X[2] \oplus X[1] \oplus X[0] \oplus X[-1]$;

$U[4]=X[4] \oplus X[2] \oplus X[0]$;

$U[5]=X[4] \oplus X[3] \oplus X[2] \oplus X[1] \oplus X[0]$

In addition to the N-th group, two previous groups (the (N−2)-th and (N−1)-th groups) and two following groups (the (N+1)-th and (N+2)-th groups) are also listed for reference:

The (N−2)-th Group:

$U[-9]=X[-7] \oplus X[-8] \oplus X[-9] \oplus X[-10] \oplus X[-11]$;

$U[-8]=X[-6] \oplus X[-7] \oplus X[-8] \oplus X[-9] \oplus X[-10]$;

$U[-7]=X[-5] \oplus X[-6] \oplus X[-7] \oplus X[-8] \oplus X[-9]$;

$U[-6]=X[-4] \oplus X[-6] \oplus X[-8]$;

$U[-5]=X[-4] \oplus X[-5] \oplus X[-6] \oplus X[-7] \oplus X[-8]$;

The (N−1)-th Group:

$U[-4]=X[-3] \oplus X[-4] \oplus X[-5] \oplus X[-6] \oplus X[-7]$;

$U[-3]=X[-2] \oplus X[-3] \oplus X[-4] \oplus X[-5] \oplus X[-6]$;

$U[-2]=X[-1] \oplus X[-2] \oplus X[-3] \oplus X[-4] \oplus X[-5]$;

$U[-1]=X[0] \oplus X[-2] \oplus X[-4]$;

$U[0]=X[0] \oplus X[-1] \oplus X[-2] \oplus X[-3] \oplus X[-4]$;

The (N+1)-th Group:

$U[6]=X[5] \oplus X[4] \oplus X[3] \oplus X[2] \oplus X[1]$;

$U[7]=X[6] \oplus X[5] \oplus X[4] \oplus X[3] \oplus X[2]$;

$U[8]=X[7] \oplus X[6] \oplus X[5] \oplus X[4] \oplus X[3]$;

$U[9]=X[8] \oplus X[6] \oplus X[4]$;

$U[10]=X[8] \oplus X[7] \oplus X[6] \oplus X[5] \oplus X[4]$;

The (N+2)-th Group:

$U[11]=X[9] \oplus X[8] \oplus X[7] \oplus X[6] \oplus X[5]$;

$U[12]=X[10] \oplus X[9] \oplus X[8] \oplus X[7] \oplus X[6]$;

$U[13]=X[11] \oplus X[10] \oplus X[9] \oplus X[8] \oplus X[7]$;

$U[14]=X[12] \oplus X[10] \oplus X[8]$;

$U[15]=X[12] \oplus X[11] \oplus X[10] \oplus X[9] \oplus X[8]$.

According to the five consecutive groups of the output bits, an identity equation, irrelevant to the input bits, can be found as follows:

$$U[-6] \oplus U[-5] \oplus U[-4] \oplus U[-3] \oplus U[-2] \oplus U[-1] \oplus U[1] \\ \oplus U[4] \oplus U[5] \oplus U[8] \oplus U[9] \oplus U[11] \oplus U[12] \oplus U \\ [13] \oplus U[14] \oplus U[15]=0 \quad (3)$$

Similarly, for the punctured binary convolutional encoder 330, an identity equation, irrelevant to the input bits, can also be found as follows:

$$V[-6] \oplus V[-5] \oplus V[-4] \oplus V[-3] \oplus V[-2] \oplus V[-1] \oplus V[1] \\ \oplus V[4] \oplus V[5] \oplus V[8] \oplus V[9] \oplus V[11] \oplus V[12] \oplus V \\ [13] \oplus V[14] \oplus V[15]=0 \quad (4)$$

Identity equations (3) and (4) relate only to the output bits U and V, but are irrelevant to the input bits X and Y, which reveals that identity equations (3) and (4) can be used in the receiver to verify the received bits by using the relationship there between without knowledge of the decoded bits. If the receiver chooses an indicator for one of five possible punctured positions, the receiver can divide an incoming bit stream into consecutive 5-bit groups according to the chosen punctured position. If the chosen punctured position is correct, the result of the logic operation of the incoming bits expressed by the left side of equation (3) or (4) should be zero. If the chosen punctured position is incorrect, the result of the logic operation of the incoming bits expressed by the left side of equation (3) or (4) depends on the original information bits and can be one or zero. Repeatedly applying the identity equation to the received bits and accumulating the results can enhance the distinction between the results of correct and incorrect punctured positions and diminish the noise effect impacting the transmitted signal over a transmission medium.

In addition, equations (3) and (4) can be expressed by a parity check polynomial P(x) to unify the representation format:

$$P(x)=x^*(1+x+x^2+x^3+x^4+x^6+x^7+x^{10}+x^{11}+x^{14}+x^{16}+x^{17}+ \\ x^{18}+x^{19}+x^{20}+x^{21}) \quad (5)$$

where the single factor x preceding the parenthesis is used to adjust the timing correspondence.

Figure 1:
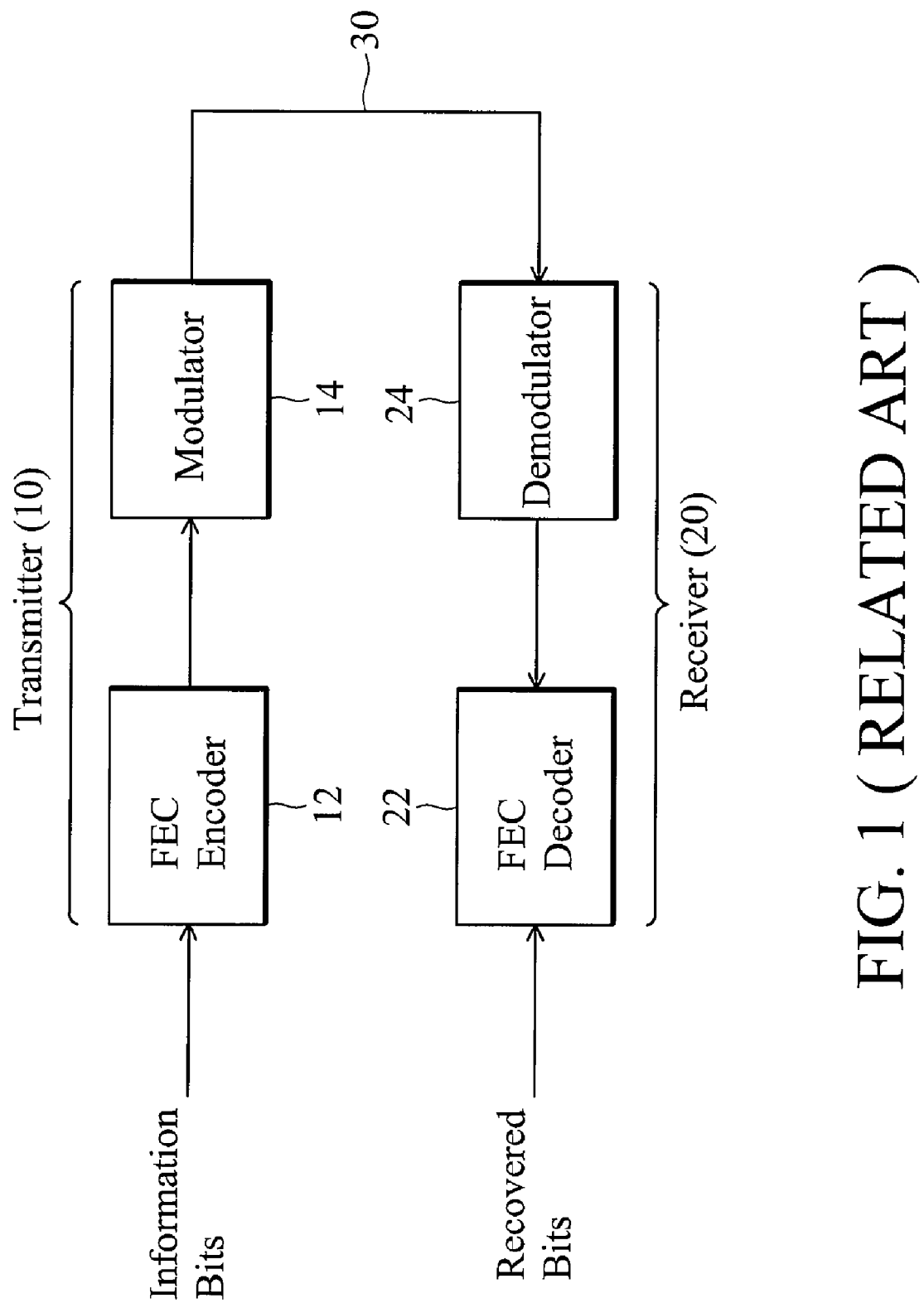
FIG. 1 (Related Art) is a block diagram of a typical digital communication system.
Figure 2:
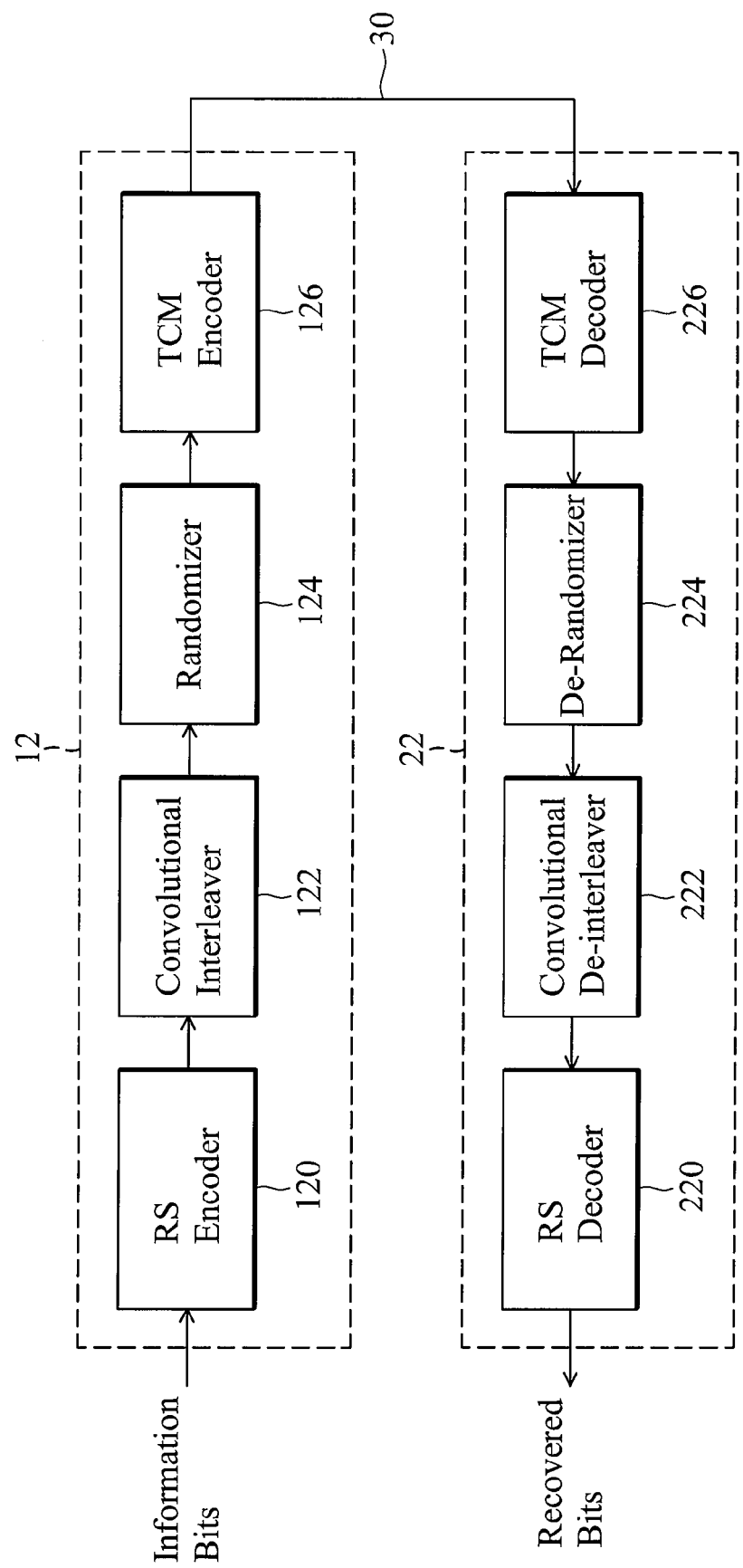
FIG. 2 (Related Art) is a block diagram of a conventional cable modem transmission system complying with the standard of ITU-R Recommendation J-83 Annex B.
Figure 5:
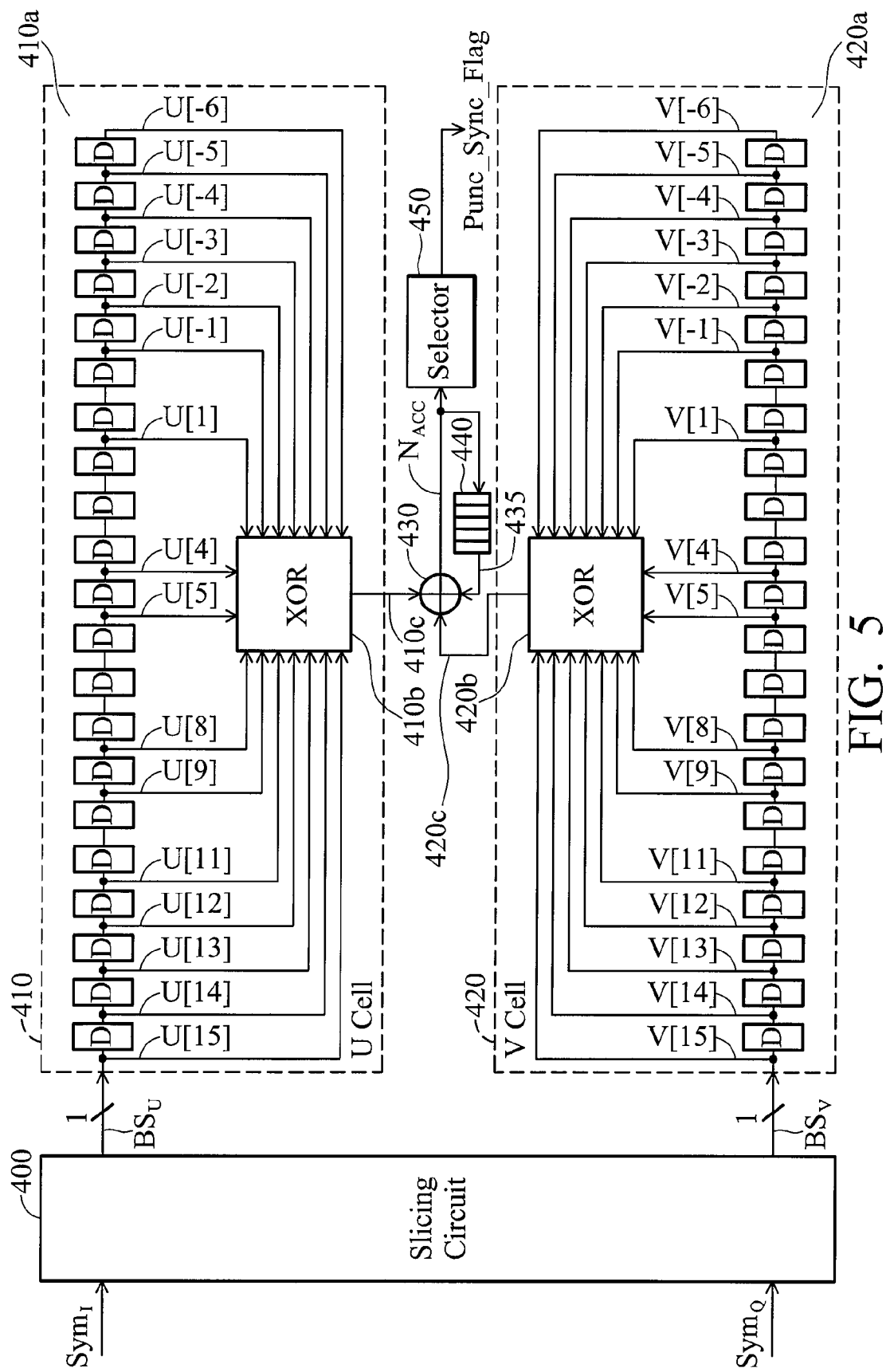
FIG. 5 is a block diagram of an apparatus for determining a detected punctured position of punctured convolutional codes complying with the J83B standard in accordance with the first embodiment of the invention.
Figure 6:
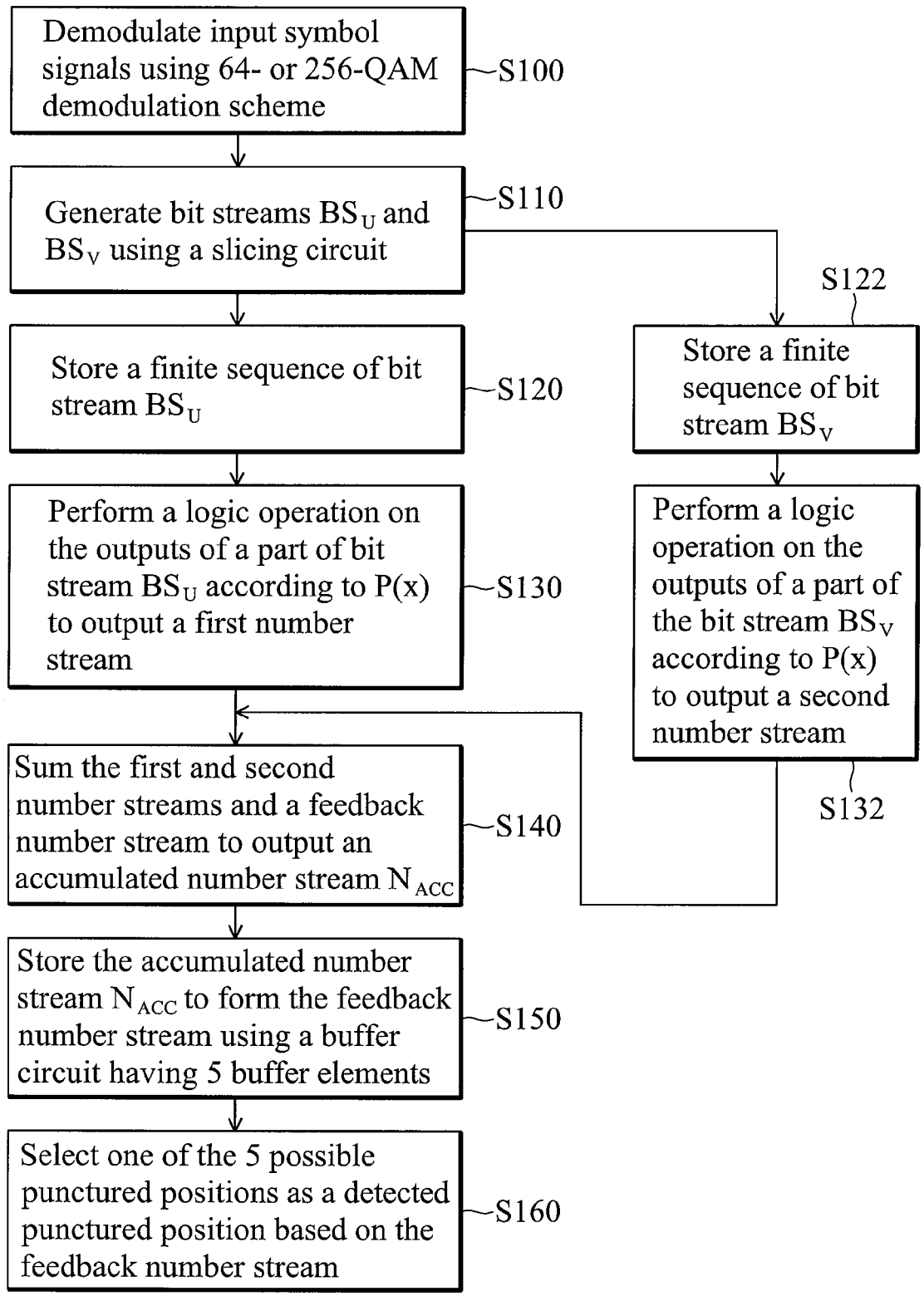
FIG. 6 is a flow chart of a method for determining a detected punctured position of punctured convolutional codes complying with the J83B standard in accordance with the first embodiment of the invention.

An apparatus for determining a detected punctured position of punctured convolutional codes complying with the J83B standard is illustrated in FIG. 5, which utilizes the parity check polynomial P(x) to directly estimate a detected punctured position. The apparatus of FIG. 5 can be applied to a receiver, for example, in the TCM decoder 226 shown in FIG. 2. In the receiver, a QAM demodulator (not shown) receives a signal stream and consecutively demodulates each of the received signals into an in-phase symbol stream $Sym_I$ and a quadrature symbol stream $Sym_Q$, using 64-QAM demodulation scheme in this embodiment. The apparatus of FIG. 5 receiving the in-phase symbol stream $Sym_I$ and the quadrature symbol stream $Sym_Q$, includes a slicing circuit 400, a U cell 410, a V cell 420, an adder 430, a buffer circuit 440 and a selector 450. The U cell 410 includes a delay line circuit 410a having a plurality of delay elements D connected in series, and a logic gate XOR circuit 410b having a plurality of inputs respectively coupled to the outputs of a part of the delay elements D of the delay line circuit 410a. The V cell 420 includes a delay line circuit 420a having a plurality of delay elements D connected in series, and a logic gate XOR circuit 420b having a plurality of inputs respectively coupled to the outputs of a part of the delay elements D of the delay line circuit 420a. The U cell 410 and the V cell 420 have similar structures and are used to manipulate a pair of orthogonal bit streams.

Figure 3:
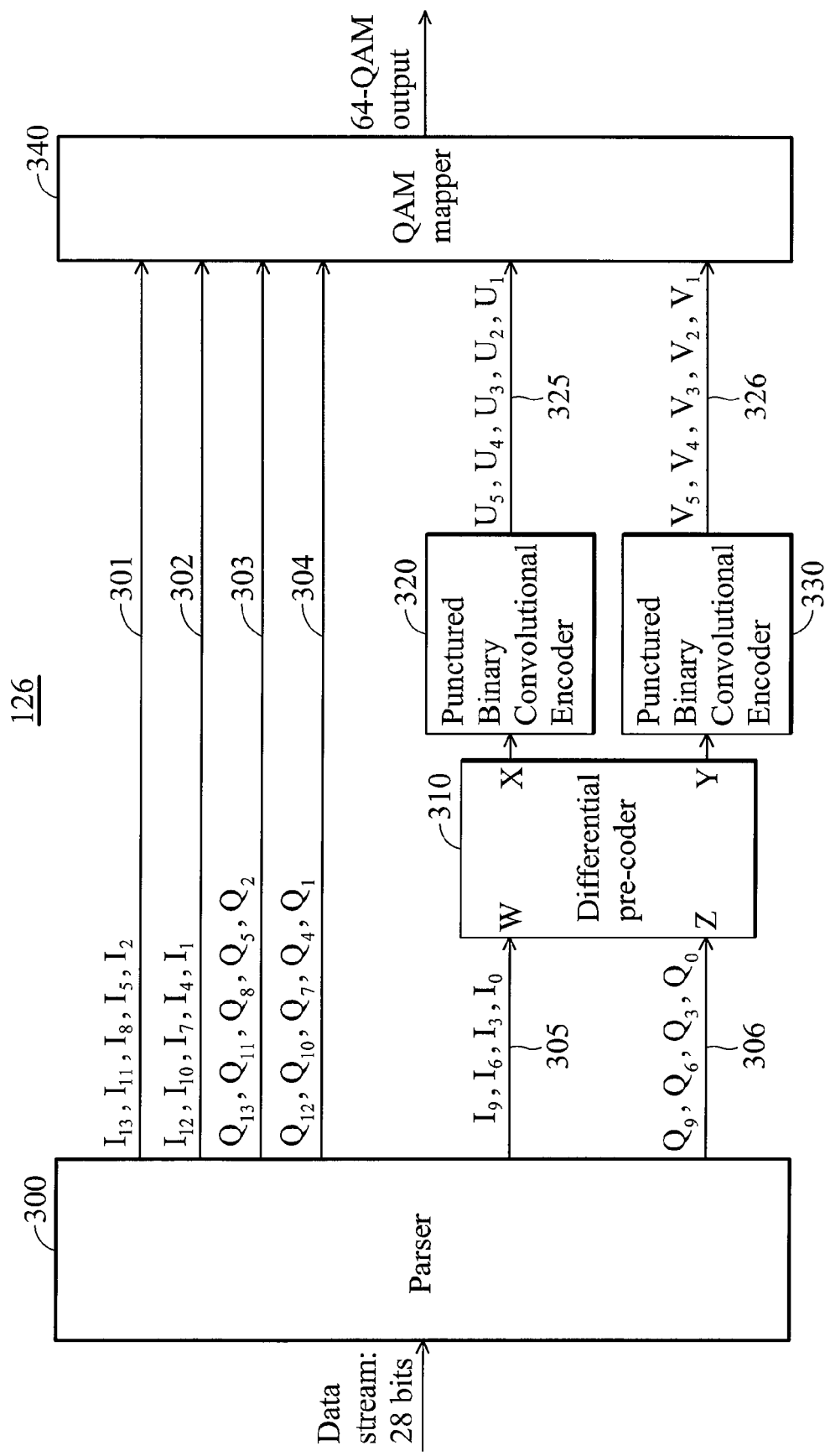
FIG. 3 (Related Art) is a block diagram of a conventional TCM encoder with the 64-QAM modulator shown in FIG. 2.

The slicing circuit 400 receives the in-phase symbol stream $Sym_I$ and the quadrature symbol stream $Sym_Q$ from the QAM demodulator and generates corresponding bit streams $BS_U$ and $BS_V$ corresponding to coded bit streams in the transmitter. Referring to FIG. 3, each pair of I- and Q-symbols received by the QAM mapper 340 has six bits, four bits from the uncoded bit streams 301-304 and two bits from the coded bit streams 325 and 326. The slicing circuit 400 converts each pair of I- and Q-symbols of the symbol streams $Sym_I$ and $Sym_Q$ into a series of bits and generates the bit streams $BS_U$ and $BS_V$ corresponding to the coded bit streams.

The bit streams $BS_U$ and $BS_V$ are sent to the U cell 410 and the V cell 420, respectively. For U cell 410, the delay line circuit 410a stores a finite sequence of the bit stream $BS_U$ using a plurality of unit delay elements D connected in series. As depicted in FIG. 5, the delay line circuit 410a has 21 unit delay elements to store the sequence from U[−6] to U[14] of the bit stream $BS_U$. According to the parity check polynomial P(x), the outputs of the first (Right), second, third, fourth, fifth, sixth, eighth, eleventh, twelfth, fifteenth, sixteenth, eighteenth, nineteenth, twentieth, and twenty-first (Left) unit delay elements and the current bit are connected to the inputs of the logic gate XOR circuit 410b. The logic gate XOR circuit 410b consecutively performs XOR operation on these inputs to generate a number stream 410c. Each number in the number stream 410c represents the result of the identity equation (3) corresponding to one of the five possible punctured positions.

Similarly, for V cell 420, the delay line circuit 420a stores a finite sequence of the bit stream $BS_V$ using a plurality of unit delay elements D connected in series. As depicted in FIG. 5, the delay line circuit 420a also has 21 unit delay elements to store the sequence from V[−6] to V[14] of the bit stream $BS_V$. According to the parity check polynomial P(x), the outputs of the first (Right), second, third, fourth, fifth, sixth, eighth, eleventh, twelfth, fifteenth, sixteenth, eighteenth, nineteenth, twentieth, and twenty-first (Left) unit delay elements and the current input bit are connected to the inputs of the logic gate XOR circuit 420b. The logic gate XOR circuit 420b performs XOR operation on these inputs to generate a number stream 420c. Each number in the number stream 420c represents the result of the identity equation (4) corresponding to one of the five possible punctured positions.

In this embodiment, two blocks, U cell 410 and V cell 420, are included to manipulate the bit streams $BS_U$ and $BS_V$, respectively. It is noted that U cell 410 or V cell 420 can individually achieve the objective of determining punctured positions in the incoming bit stream. Cooperation of U cell 410 and V cell 420 can shorten the cycle of iterations for testing but requires more components.

Adder 430 sums the number streams 410c and 420c and a feedback number stream 435 from the buffer device 440 to output a number stream $N_{ACC}$. The buffer circuit 440 has 5 buffer elements corresponding to the five possible punctured positions to receive and delay the accumulated number stream $N_{ACC}$, forming the feedback number stream 435. Adder 430 and the buffer device 440 constitute an accumulator, which accumulates the results of the XOR operations based on equations (3) and (4) for the five possible punctured positions, respectively. As stated above, if one of the punctured positions is correct, the result of the logic operation XOR should be zero; if one of the punctured positions is incorrect, the result of the XOR logic operation depends on the original information bits and can be one or zero. Accordingly, the accumulated number of the accumulated number stream $N_{ACC}$ corresponding to the correct punctured position remains at or is close to zero while those corresponding to the incorrect punctured positions increase rapidly.

Selector 450 selects one of the five possible punctured positions based on the accumulated number stream $N_{ACC}$ stored in the five buffer elements of the buffer device 440 and generates an indicator Punc_Sync_Flag, indicating a detected punctured position at an instant when predetermined iterations have been performed. The detected punctured position indicated by the indicator Punc_Sync_Flag corresponds to one of the five buffer elements storing a minimal value of the accumulated number stream $N_{ACC}$. After determining the detected punctured position, the indicator Punc_Sync_Flag indicating the detected punctured position is sent to a TCM decoder (usually, Viterbi decoder, not shown) to normally decode the input streams $Sym_I$ and $Sym_Q$.

In the first embodiment, there are five possible punctured positions since the punctured code rate is 4/5, that is a group of 4 input bits can be converted to a group of 5 output bits. Thus the length of the buffer circuit 440 is five. It is understood by those skilled in the art that the length of the buffer circuit 440 varies with the punctured code rate of the punctured convolutional encoder. For example, if the punctured code rate is Z/R, where Z and R are positive integers, the length of the buffer circuit 440 is set to R to accommodate all possible punctured positions. In addition, for a specific punctured convolution encoder, the length of the delay line circuit storing a finite sequence of the input bit stream may vary with its identity equation or parity check polynomial based on the relationship of its input bits and output bits. It is possible that more than one identity equation or parity check polynomial can exist for a specific punctured convolutional encoder. However, more terms of the parity check polynomial may suffer from more noise impact on the result. Accordingly, the identity equation or parity check polynomial with least terms is preferred.

A method for determining a detected punctured position of punctured convolutional codes complying with the J83B standard is illustrated in FIG. 5. Input symbol signals from a transmitter are received. The input symbol signals are demodulated using 64- and 256-QAM demodulation scheme into symbol stream $Sym_I$ and $Sym_Q$ (step S100). The in-phase symbol stream $Sym_I$ and the quadrature symbol stream $Sym_Q$ are processed by a slicing circuit to generate corresponding bit streams $BS_U$ and $BS_V$ (Step S110). Then the bit streams $BS_U$ and $BS_V$ are individually processed. For the bit stream $BS_U$, a finite sequence of the bit stream $BS_U$ is stored in a first delay line circuit (step S120). A first logic gate XOR receives outputs of a part of the bit stream $BS_U$ based on the parity check polynomial and generate a first number stream (step S130). In addition, for the bit stream $BS_V$, a finite sequence of the bit stream $BS_V$ is stored in the second delay line circuit (step S122). A second logic gate XOR receives outputs of a part of the bit stream $BS_U$ based on the parity check polynomial and generates a second number stream (step S132). The first and second number streams and a feedback number stream are summed to output an accumulated number stream $N_{ACC}$ (step S140). The accumulated number stream $N_{ACC}$ is delayed to form the feedback number stream using a buffer circuit having five buffer elements to store the results of the parity check polynomial corresponding to each of the five possible punctured positions (step S150). Finally, one of the five punctured positions is selected based on the feedback number stream as the detected punctured position (step S160).

Second Embodiment

Figure 7:
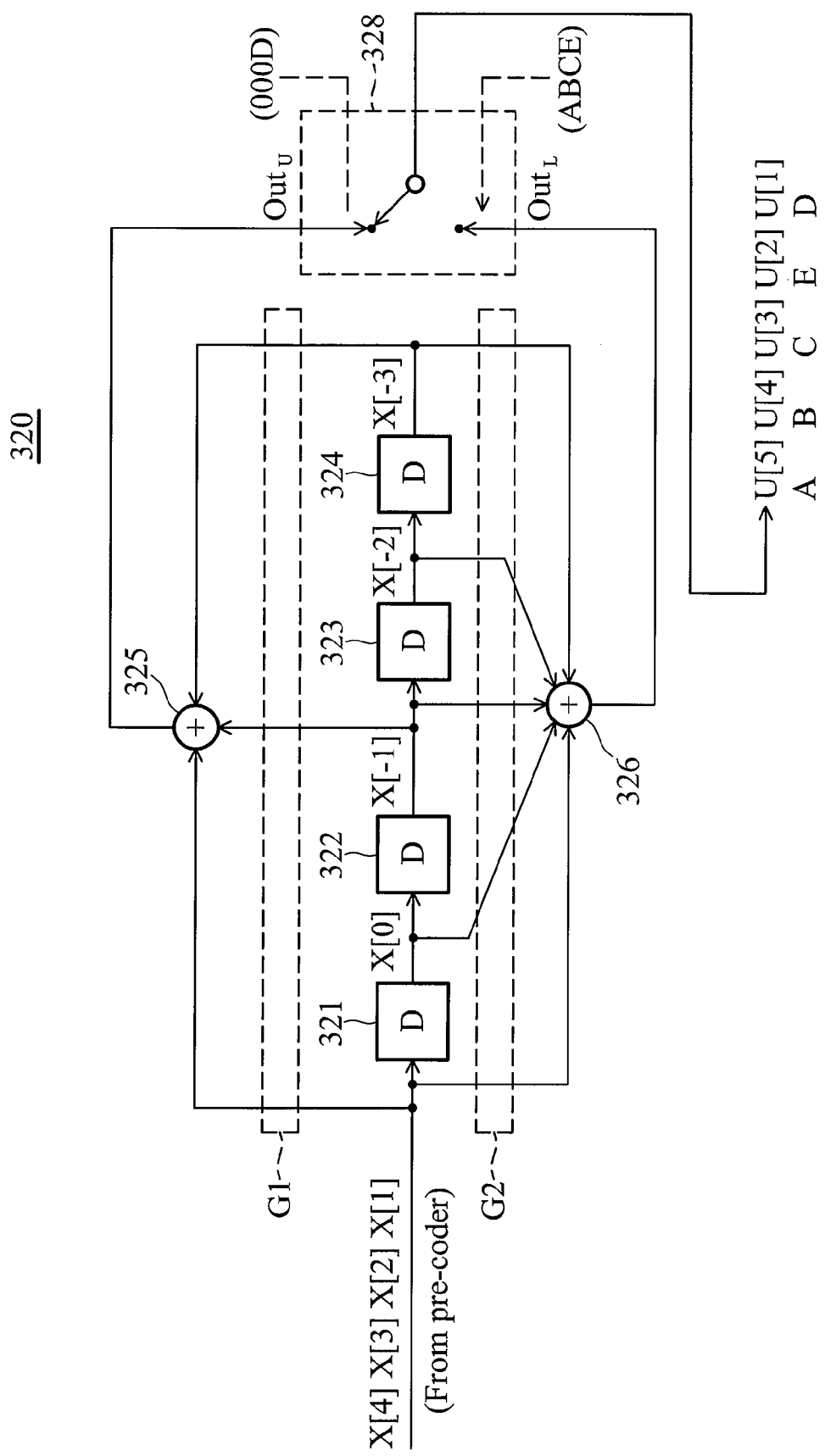
FIG. 7 is a block diagram of a punctured binary convolutional encoder in accordance with the second embodiment of the invention.

In the first embodiment, the identity equations (3) and (4) are determined based on the structure of the binary punctured convolutional encoder shown in FIG. 4. As illustrated in FIG. 4, the puncture matrix [P1;P2] is [000D;ABCE]. In the second embodiment, as shown in FIG. 7, the puncture matrix remains unchanged but the order of the output bits is different from that of the first embodiment, where the order U[1], U[2], U[3], U4], and U[5] corresponds to the locations {ABCDE} indicated in the puncture matrix, unlike here, wherein output bits of U[1], U[2], U[3], U4] and U[5] correspond to the locations {DECBA} indicated in the puncture matrix.

A group of the output bits (U[5],U[4],U[3],U[2],U[1]) is expressed as functions of a corresponding group of the input bits (X[4],X[3],X[2],X[1]) and previous input bits (or internal states of the encoder, X[0],X[−1],X[−2],X[−3]) as follows:

The N-th Group:

$U[1]=X[1]\oplus X[-1]\oplus X[-3]$ $U[2]=X[1]\oplus X[0]\oplus X[-1]\oplus X[-2]\oplus X[-3]$ $U[3]=X[2]\oplus X[1]\oplus X[0]\oplus X[1]\oplus X[-2];$ $U[4]=X[3]\oplus X[2]\oplus X[1]\oplus X[0]\oplus X[-1];$ $U[5]=X[4]\oplus X[3]\oplus X[2]\oplus X[1]\oplus X[0].$ In addition to the N-th group, one previous group (the (N−1)-th groups) and three following groups (the (N+1)-th, (N+2)-th and (N+3)-th groups) are also listed for reference:

The (N−1)-th Group:

$U[-4]=X[-3]\oplus X[-5]\oplus X[-7];$ $U[-3]=X[-3]\oplus X[-4]|X[-5]\oplus X[-6]\oplus X[-7];$ $U[-2]=X[-2]\oplus X[-3]\oplus X[-4]\oplus X[-5]\oplus X[-6];$ $U[-1]=X[-1]\oplus X[-2]\oplus X[-3]\oplus X[-4]\oplus X[-5];$ $U[0]=X[0]\oplus X[-1]\oplus X[-2]\oplus X[-3]\oplus X[-4];$ The (N+1)-th Group:

$U[6]=X[5]\oplus X[3]\oplus X[1];$ $U[7]=X[5]\oplus X[4]\oplus X[3]\oplus X[2]\oplus X[1];$ $U[8]=X[6]\oplus X[5]\oplus X[4]\oplus X[3]\oplus X[2];$ $U[9]=X[7]\oplus X[6]\oplus X[5]\oplus X[4]\oplus X[3];$ $U[10]=X[8]\oplus X[7]\oplus X[6]\oplus X[5]\oplus X[4];$ The (N+2)-th Group:

$U[11]=X[9]\oplus X[7]\oplus X[5];$ $U[12]=X[9]\oplus X[8]\oplus X[7]\oplus X[6]\oplus X[5];$ $U[13]=X[10]\oplus X[9]\oplus X[8]\oplus X[7]\oplus X[6];$ $U[14]=X[11]\oplus X[10]\oplus X[9]\oplus X[8]\oplus X[7];$ $U[15]=X[12]\oplus X[11]\oplus X[10]\oplus X[9]\oplus X[8].$ The (N+3)-th Group:

$U[16]=X[13]\oplus X[11]\oplus X[9];$ $U[17]=X[13]\oplus X[12]\oplus X[11]\oplus X[10]\oplus X[9].$ According to the five consecutive groups of the output bits, an identity equation, irrelevant to the input bits, can be found as follows:

$$U[-4]\oplus U[-3]\oplus U[-2]\oplus U[-1]\oplus U[0]\oplus \\ U[1]\oplus U[3]\oplus U[6]\oplus U[7]\oplus U[10]\oplus U[11]\oplus \\ U[13]\oplus U[14]\oplus U[15]\oplus U[16]\oplus U[17]\equiv 0 \quad (6)$$

It is obvious that equation (3) for the first embodiment and equation (6) for the second embodiment are similar and only different by some time shifting. Thus, the apparatus and method disclosed in the first embodiment can be modified to implement the second embodiment. The time shifting between the first and second embodiments can be modified by adding delay elements in the delay line circuits 410a and 420a, or adjusting correspondence between the stored number stream $N_{ACC}$ and the punctured positions in the selector 450 shown in FIG. 5.

Third Embodiment

In the first and second embodiments, the J83B standard is applied to illustrate the principle of the invention with no intention to limit the scope thereof. In fact, the critical issue is determination of an identity equation or parity check polynomial, like equations (3)-(6), based on a specific puncture convolutional encoder used in a communication system. An example for the European DVB (Digital Video Broadcasting) standard is illustrated here.

Figure 8:
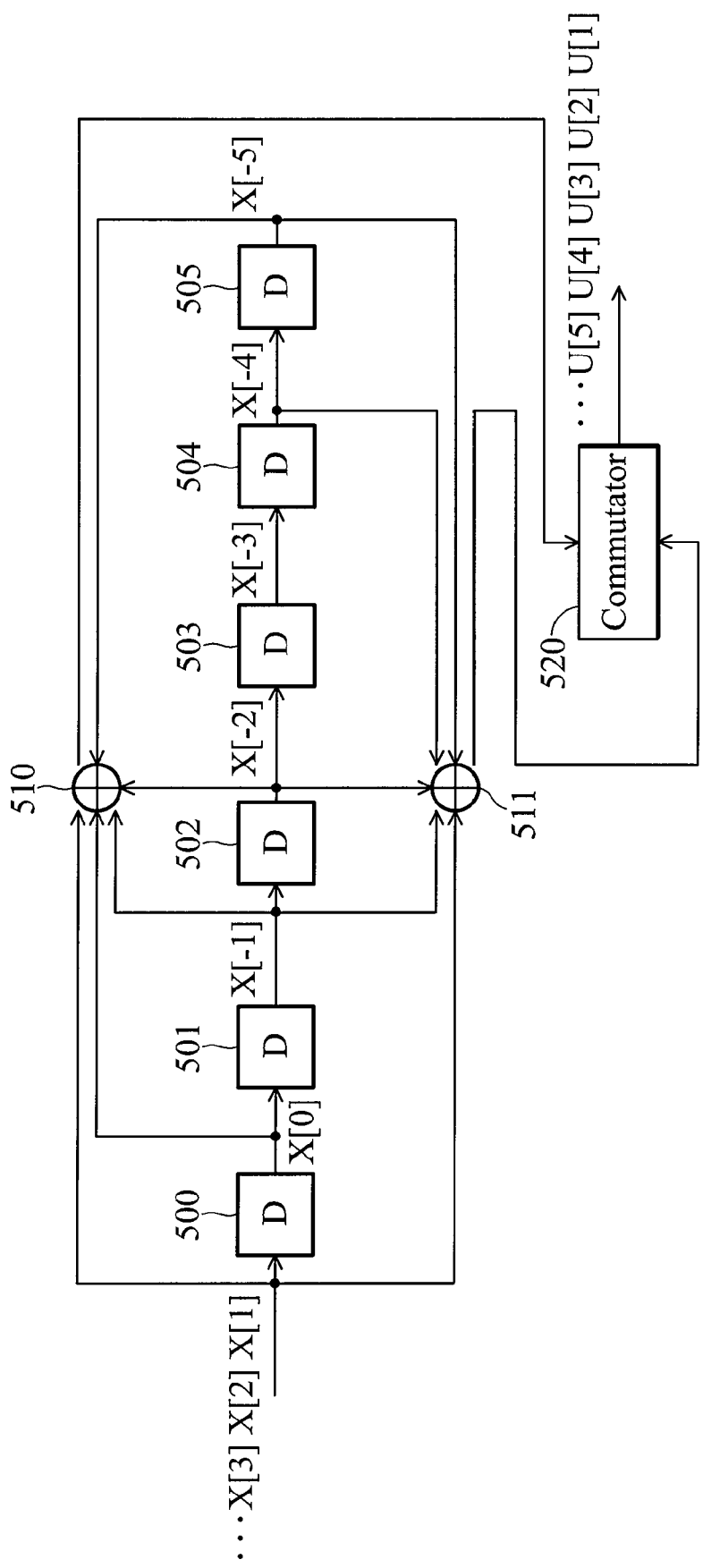
FIG. 8 is a block diagram of a punctured binary convolutional encoder complying with the European DVB standard in accordance with the third embodiment of the invention.

FIG. 8 is a block diagram of a punctured binary convolutional encoder complying with the European DVB standard. The punctured convolutional encoder includes six registers 500-505, two exclusive-OR gates 510 and 511, and a commutator 520. The six registers 500-505 store six previous input bits X[0], X[−1], X[−2], X[−3], X[−4] and X[−5]. As shown in FIG. 8, codes $OUT_U$ and $OUT_L$ input to the commutator 520 can be expressed by:

$$OUT_U=X[1]\oplus X[0]\oplus X[-1]\oplus X[-2]\oplus X[-5]; \quad (7)$$

$$OUT_L=X[1]\oplus X[-1]\oplus X[-2]\oplus X[-4]\oplus X[-5] \quad (8)$$

The European DVB standard suggests three options for punctured code rates, including 1/2, 2/3 and 3/4. According to equations (7) and (8) and a specific punctured code rate, at least one identity equation merely involving the output bits and its parity check polynomial can be found. The deduction is omitted here for clarity.

For 1/2 Punctured Code Rate:

$$U[1]\oplus U[2]\oplus U[4]\oplus U[5]\oplus U[7]\oplus U[8]\oplus U[11]\oplus U[13]\oplus U[15]\oplus U[16]=0 \quad (9)$$

$$P(x)=1+x+x^3+x^5+x^8+x^9+x^{11}+x^{12}+x^{14}+x^{15} \quad (10)$$

For 2/3 Punctured Code Rate:

U[1]⊕U[2]⊕U[3]⊕U[4]⊕U[8]⊕U[10]⊕U[12]⊕U[13]⊕U[15]⊕U[18]⊕U[19]⊕U[20]=0  (11)

$$P(x)=1+x+x^2+x^5+x^7+x^8+x^{10}+x^{12}+x^{16}+x^{17}+x^{18}+x^{10}$$  (12)

For 3/4 Punctured Code Rate:

U[1]⊕U[2]⊕U[3]⊕U[4]⊕U[7]⊕U[10]⊕U[14]⊕U[15]⊕U[16]⊕U[24]⊕U[28]⊕U[29]⊕U[31]⊕U[32]⊕U[33]⊕U[34]=0  (13)

$$P(x) = 1 + x + x^2 + x^3 + x^5 + x^6 + x^{10} + x^{18} + x^{19} + x^{20} + x^{24} + x^{27} + x^{30} + x^{31} + x^{32} + x^{33}$$  (14)

Accordingly, based on the parity check polynomials (10), (12) and (14), the apparatus shown in FIG. 5 can be modified to implement the third embodiment and will not be described in detail.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for determining one of possible punctured positions as a detected punctured position corresponding to a first input bit stream, comprising:
    a first delay line circuit having a plurality of first delay elements connected in series for storing a first finite sequence of the first input bit stream;
    a first logic gate circuit having a plurality of inputs, respectively coupled to the outputs of a part of the first delay elements of the first delay line circuit in accordance with a polynomial, for performing a logic operation on the outputs of the part of the first delay elements to output a first number stream;
    an adder for summing the first number stream and a feedback number stream to form an accumulated number stream;
    a buffer circuit having a plurality of buffer elements, for storing the accumulated number stream to form the feedback number stream, wherein each number of the feedback number stream is associated with one of possible punctured positions; and
    a selector for selecting one of possible punctured positions based on the feedback number stream as the detected punctured position.

2. The apparatus of claim 1, wherein the first input bit stream has a punctured code rate of Z/R, where Z and R are positive integers and the feedback number stream has R numbers corresponding to R possible punctured positions.

3. The apparatus of claim 1, wherein the first logic gate circuit is an XCR gate.

4. The apparatus of claim 1, wherein the selector selects one of the possible punctured positions corresponding to a minimal number of the feedback number stream as the detected puncture position.

5. The apparatus of claim 1, further comprising:
    a second delay line circuit having a plurality of second delay elements connected in series for storing a second finite sequence of a second input bit stream associate with the first input bit stream; and
    a second logic gate circuit having a plurality of inputs, respectively coupled to the outputs of a part of the second delay elements of the second delay line circuit in accordance with the polynomial, for performing a logic operation on the outputs of the part of the second delay elements to output a second number stream;
    wherein the adder further receives the second number stream, respectively sums up the first number stream and the second number stream and the feedback number stream to form the accumulated number stream.

6. The apparatus of claim 3, wherein the second logic gate circuit is an XOR gate.

7. The apparatus of claim 1, wherein the first input bit stream complies with the standard of the ITU-T Recommendation J.83 Annex B.

8. The apparatus of claim 7, wherein the polynomial is a parity check polynomial P(x) expressed by: $P(x)=x*(1+x+x^2+x^3+x^4+x^6+x^7+x^{10}+x^{11}+x^{14}+x^{16}+x^{17}+x^{18}x^{19}x^{20}x^{21})$.

9. The apparatus of claim 1, wherein the first input bit stream complies with the European DVB standard.

10. The apparatus of claim 9, wherein a code rate is 1/2 and the polynomial is a parity check polynomial P(x) expressed by: $P(x)=1+x+x^3+x^5+x^8+x^9+x^{11}+x^{12}+x^{14}+x^{15}$.

11. The apparatus of claim 9, wherein a code rate is 2/3 and the polynomial is a parity check polynomial P(x) expressed by: $P(x)=1+x+x^2+x^5+x^7+x^8+x^{10}+x^{12}+x^{16}+x^{17}+x^{18}x^{19}$.

12. The apparatus of claim 9, wherein a code rate is 3/4 and the polynomial is a parity check polynomial P(x) expressed by: $P(x)=1+x+x^2+x^3+x^5+x^6+x^{10}+x^{18}+x^{19}+x^{20}+x^{24}+x^{27}+x^{30}+x^{31}+x^{32}+x^{33}$.

13. A method for determining one of possible punctured positions as a detected punctured position corresponding to a first input bit stream, comprising:
    storing a first finite sequence of the first input bit stream;
    performing a first logic operation on part of the first finite sequence in accordance with a polynomial to output a first number stream;
    summing the first number stream and a feedback number stream to form an accumulated number stream;
    storing the accumulated number stream to form the feedback number stream, wherein each number of the feedback number stream is associated with one of possible punctured positions; and
    selecting one of possible punctured positions based on the feedback number stream as the detected punctured position.

14. The method of claim 13, wherein the first input bit stream has a punctured code rate of Z/R, where Z and R are positive integers and the feedback number stream has R numbers corresponding to R possible punctured positions.

15. The method of claim 13, wherein the first logic operation is XOR.

16. The method of claim 13, further comprising:
    storing a second finite sequence of a second input bit stream associated with the first input bit stream; and
    performing a second logic operation on part of the second finite sequence in accordance with the polynomial to output a second number stream;
    wherein during summing, the first number stream, the second number stream and the feedback number stream are summed to output the accumulated number stream.

17. The method of claim 13, wherein during selecting, one of the punctured positions corresponding to a minimal value of the accumulated number stream is selected as the detected punctured position.

18. The method of claim 13, wherein the first input bit stream complies with the standard of the ITU-T Recommendation J.83 Annex B.

19. The method of claim 18, wherein the polynomial is a parity check polynomial P(x) expressed by: $P(x)=x*(1+x+x^2+x^3+x^4+x^6+x^7+x^{10}+x^{11}+x^{14}+x^{16}+x^{17}+x^{18}+x^{19}+x^{20}x^{21})$.

20. The method of claim 13, wherein the first input bit stream complies with the European DVB standard.

21. The method of claim 20, wherein the first input bit stream has a code rate of 1/2 and the polynomial is a parity check polynomial P(x) expressed by: $P(x)=1+x+x^3+x^5+x^8+x^9+x^{11}+x^{12}+x^{14}+x^{15}$.

22. The method of claim 20, wherein the first input bit stream has a code rate of 2/3 and the polynomial is a parity check polynomial P(x) expressed by: $P(x)=1+x+x^2+x^5+x^7+x^8+x^{10}+x^{12}+x^{16}+x^{17}+x^{18}+x^{19}$.

23. The method of claim 20, wherein the first input bit stream has a code rate of 3/4 and the polynomial is a parity check polynomial P(x) expressed by: $P(x)=1+x+x^2+x^3+x^5+x^6+x^{10}+x^{18}+x^{19}+x^{20}+x^{24}+x^{27}+x^{30}+x^{31}+x^{32}+x^{33}$.

* * * * *